United States Patent
Do et al.

(10) Patent No.: US 8,890,623 B2
(45) Date of Patent: Nov. 18, 2014

(54) SYSTEM AND METHOD FOR REDUCING STRESS IN A CASCODE COMMON-SOURCE AMPLIFIER

(71) Applicant: Marvell World Trade Ltd., St. Michael (BB)

(72) Inventors: Aaron Vinh Thanh Do, Singapore (SG); Poh Boon Leong, Singapore (SG)

(73) Assignee: Marvell World Trade Ltd., Hamilton (BM)

( * ) Notice: Subject to any disclaimer, the term of this patent is extended or adjusted under 35 U.S.C. 154(b) by 0 days.

(21) Appl. No.: 14/288,927

(22) Filed: May 28, 2014

(65) Prior Publication Data

US 2014/0266467 A1    Sep. 18, 2014

Related U.S. Application Data

(63) Continuation of application No. 13/656,181, filed on Oct. 19, 2012, now Pat. No. 8,742,853.

(60) Provisional application No. 61/551,322, filed on Oct. 25, 2011.

(51) Int. Cl.
  *H03F 3/04*    (2006.01)
(52) U.S. Cl.
  USPC ............................ 330/311; 330/253; 330/277
(58) Field of Classification Search
  USPC ......................................... 330/311, 253, 277
  IPC .......................................................... H03F 3/04
  See application file for complete search history.

(56) References Cited

U.S. PATENT DOCUMENTS

| | | | |
|---|---|---|---|
| 3,999,139 A | 12/1976 | Fennell | |
| 4,973,890 A | 11/1990 | Desjardins | |
| 5,061,903 A | 10/1991 | Vasile | |
| 5,440,276 A | 8/1995 | Kim | |
| 6,690,124 B2 * | 2/2004 | Fernsler et al. | 315/382 |
| 6,888,396 B2 | 5/2005 | Hajimiri et al. | |
| 7,109,801 B2 * | 9/2006 | Li | 330/298 |
| 7,205,836 B2 | 4/2007 | Helms et al. | |
| 7,266,360 B2 | 9/2007 | Kang et al. | |
| 7,847,638 B2 * | 12/2010 | Ishizuka | 330/311 |
| 7,859,340 B2 * | 12/2010 | Miao et al. | 330/298 |
| 8,019,306 B2 | 9/2011 | Iida | |
| 2006/0119435 A1 | 6/2006 | Oh et al. | |
| 2010/0237945 A1 | 9/2010 | Cassia et al. | |
| 2011/0156817 A1 | 6/2011 | Hwang et al. | |
| 2014/0139288 A1 * | 5/2014 | Cha et al. | 330/254 |

OTHER PUBLICATIONS

Notification of Transmittal of The International Search Report and The Written Opinion of the International Searching Authority, or The Declaration dated Mar. 25, 2013 in reference to PCT/182012/002143 (9 pgs).

* cited by examiner

*Primary Examiner* — Patricia Nguyen

(57) ABSTRACT

A method of reducing stress in a cascode common-source amplifier including a first transistor and a second transistor connected in a cascode arrangement. The method includes providing an input voltage and a bias voltage to the first transistor and the second transistor, respectively, connected in the cascode arrangement, generating, based on the input voltage and the bias voltage, an output current, and equalizing stress associated with operation of each of the first transistor and the second transistor. Equalizing the stress includes, in response to the input voltage decreasing by an amount sufficient to cause the first transistor and the second transistor to turn off, equalizing respective voltage drops across the first transistor and the second transistor.

16 Claims, 7 Drawing Sheets

SYSTEM AND METHOD FOR REDUCING STRESS IN A CASCODE COMMON-SOURCE AMPLIFIER

CROSS-REFERENCE TO RELATED APPLICATIONS

The present disclosure is a continuation of U.S. patent application Ser. No. 13/656,181 (now U.S. Pat. No. 8,742, 853), filed on Oct. 19, 2012, which claims the benefit of U.S. Provisional Application No. 61/551,322, filed on Oct. 25, 2011. The disclosure of the above application is incorporated herein by reference in its entirety.

FIELD

The present disclosure relates to amplifiers, and more particularly to cascode common-source amplifiers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Maximum power deliverable by a cascode common-source (CS) amplifier is limited by the maximum stress that the device can tolerate. One stress parameter relates to a drain-source voltage $V_{DS}$ across a transistor. Referring now to FIG. 1, a cascode CS amplifier may be used to increase the maximum power deliverable in a single stage. The cascode CS amplifier includes a transistor $N_1$ and a transistor $N_2$. A control terminal of the transistor $N_2$ may be connected to a bias signal $V_b$. A first terminal of the transistor $N_1$ is connected to a second terminal of the transistor $N_2$. A second terminal of the transistor $N_1$ is connected to a reference potential such as ground. A control terminal of the transistor $N_1$ receives an input voltage $V_{in}$ and an output current $I_{out}$ is generated.

The cascode CS amplifier transforms an input voltage into an output current. The voltage at the output of the cascode CS amplifier depends on a load. When the input swings low, the output will swing high due to the inverting nature of the cascode CS amplifier. In this state, the transistors $N_1$ and $N_2$ will turn off. In order for the transistor $N_2$ to turn off, the source voltage only needs to rise to the level of $V_{G2}-V_{TH2}$, where $V_{G2}$ is a gate bias voltage of the transistor N2 and $V_{TH2}$ is the threshold voltage of the transistor $N_2$.

For example, if a drain voltage $V_D$ of the transistor $N_2$ has a quiescent value of 3.6 V, the quiescent drain voltage $V_D$ of the transistor $N_1$ is 1.8 V, and the quiescent gate voltage $V_G$ of the transistor $N_1$ is 0.6 V, then the quiescent gate voltage $V_G$ of the transistor $N_2$ should be approximately 2.4 V. If the threshold voltage $V_{TH}$ is 0.4 V, then the maximum voltage that the drain voltage $V_D$ of the transistor $N_1$ can swing to is approximately 2.4−0.4=2.0 V. If the output voltage of the cascode CS amplifier swings to 7.2 V (which may occur in an inductively loaded cascode CS amplifier), then the drain-source voltage $V_{DS}$ across the transistor $N_1$ will reach a maximum of 2.0 V, while the drain-source voltage $V_{DS}$ of the transistor $N_2$ will reach a maximum of 5.2 V. This large voltage across the transistor $N_2$ can cause long term stress, and limit the useful lifetime of the device.

SUMMARY

An amplifier system comprises a cascode common-source (CS) amplifier including a plurality of transistors connected in a common-source configuration. A stress reducing circuit is connected to at least one of the plurality of transistors to equalize a voltage drop across the plurality of transistors.

In other features, the cascode CS amplifier includes a first transistor including a control terminal, a first terminal and a second terminal. A second transistor includes a control terminal, a first terminal and a second terminal, wherein the first terminal of the second transistor is connected to the second terminal of the first transistor.

In other features, the stress reducing circuit includes a first transistor including a control terminal, a first terminal and a second terminal. The second terminal of the first transistor is connected to a first terminal of a first one of the plurality of transistors. A capacitance has a first terminal connected to the control terminal of the first transistor and a second terminal connected to a control terminal of a second one of the plurality of transistors.

In other features, the stress reducing circuit includes a first transistor including a control terminal, a first terminal and a second terminal. The first terminal of the first transistor is connected to a first terminal of a first one of the plurality of transistors. A capacitance has a first terminal connected to the control terminal of a third transistor and a second terminal connected to a control terminal of a second one of the plurality of transistors.

In other features, the cascode CS amplifier includes N first transistors, each including a control terminal, a first terminal and a second terminal, wherein N is an integer greater than two. The stress reducing circuit includes N−1 second transistors each including a control terminal, a first terminal and a second terminal. The second terminals of the N−1 second transistors are connected to the second terminals of N−1 of the N first transistors, respectively. N−1 capacitances each have first terminals connected to the control terminals of the N−1 second transistors, respectively, and second terminals connected to the control terminal of one of the N first transistors.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

According to the present disclosure, an amplifier system includes a cascode CS amplifier and a stress reducing circuit. The stress reducing circuit helps to equalize stress on transistors in the cascode CS amplifier. In one approach, the stress reducing circuit is connected to a gate of a first or input transistor and between the transistors of the cascode CS amplifier. In another approach, the stress reducing circuit is connected to a gate of one of the transistors.

Figure 2:
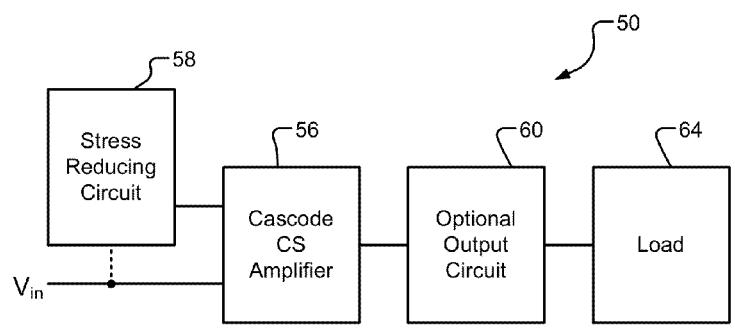
FIG. 2 is a functional block diagram of an example of an amplifier system including a stress reducing circuit according to the present disclosure.

Referring now to FIG. 2, an example of an amplifier system 50 according to the present disclosure is shown to include a cascode CS amplifier 56 and a stress reducing circuit 58. The stress reducing circuit 58 works with the cascode CS amplifier 56 and helps to equalize stress on transistors in the cascode CS amplifier 56. In other words, the stress reducing circuit 58 attempts to equalize a voltage drop across the two or more transistors of the cascode CS amplifier 56. An optional output circuit 60 communicates with an output of the cascode CS amplifier 56. A load 64 is connected to an output of the cascode CS amplifier 56 or the optional output circuit 60.

Figure 3:
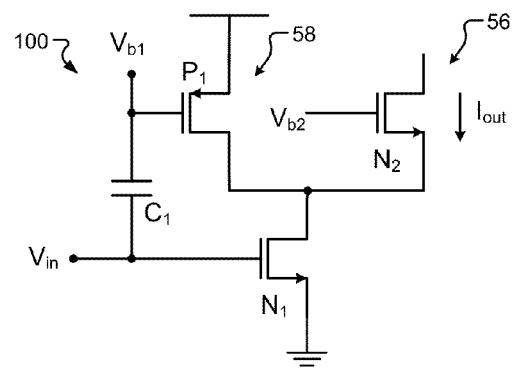
FIG. 3 is a schematic diagram of another example of an amplifier system including a stress reducing circuit according to the present disclosure.

Referring now to FIG. 3, an example of an amplifier system 100 according to the present disclosure is shown. The amplifier system 100 includes a cascode CS amplifier 56 including a transistor $N_1$ and a transistor $N_2$. A control terminal of the transistor $N_2$ may be connected to a reference potential. A first terminal of the transistor $N_1$ is connected to a second terminal of the transistor $N_2$. The transistors $N_1$ and $N_2$ may be NMOS transistors. A second terminal of the transistor $N_1$ is connected to a reference potential such as ground.

The amplifier system 100 further includes the stress reducing circuit 58, which includes a transistor $P_1$ having a first terminal connected to a reference potential and a second terminal connected between the first terminal of $N_1$ and the second terminal of $N_2$. The transistor $P_1$ may be a PMOS transistor. The stress reducing circuit 56 further includes a capacitor $C_1$ that is connected between a control terminal of the transistor $P_1$ and a control terminal of the transistor $N_1$. A control terminal of the transistor $N_1$ receives an input voltage $V_{in}$ and an output current $I_{out}$ is generated.

Transistors in the amplifier system 100 have reduced stress, which improves the useful life of the device. When the input swings low and the transistors $N_1$ and $N_2$ turn off, the impedance at the drain of the transistor $N_1$ becomes large. According to the present disclosure, the transistor $P_1$ may be used to pull the drain voltage up to the supply voltage of the transistor $P_1$. In some examples, the transistor $P_1$ may be smaller than transistor $N_1$.

In order to ensure that the transistor $P_1$ does not affect the quiescent operating point between the transistor $N_1$ and the transistor $N_2$, the transistor $P_1$ can be biased so that a conduction angle thereof is less than 180 degrees. In this way, the transistor $P_1$ only turns on when the signal swings are large, and specifically, when the transistor $N_1$ and the transistor $N_2$ are both off.

Following the previous example, when the input voltage swings low, the transistors $N_1$ and $N_2$ will turn off. The drain voltage $V_D$ of the transistor $N_2$ may then swing as high as 7.2 V. At the same time, the transistor $P_1$ will turn on, and if a supply voltage of the transistor $P_1$ is 3.6 V, then the drain voltage $V_D$ of the transistor $N_1$ will swing to 3.6 V. Therefore, the maximum drain-source voltage across the transistors $N_1$, $N_2$, and $P_1$ will all be 3.6 V. The even distribution of voltage across the devices will ensure minimum stress to the devices.

Figure 1:
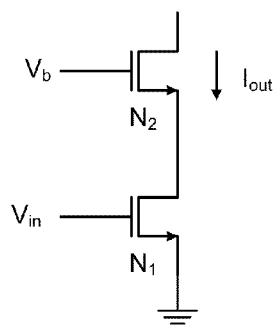
FIG. 1 is a schematic diagram of a cascode common-source (CS) amplifier according to the prior art.
Figure 4:
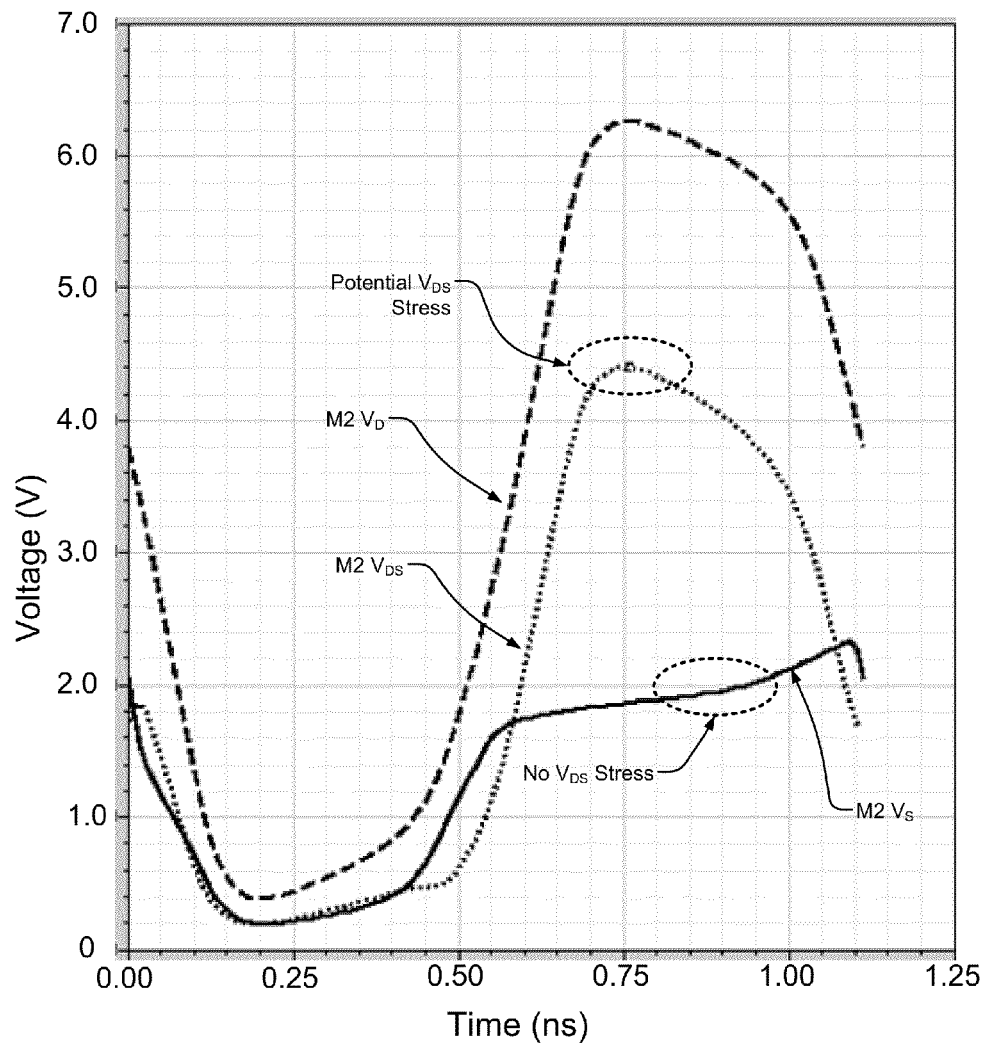
FIG. 4 is a graph illustrating examples of $V_D$, $V_S$ and $V_{DS}$ as a function of time for the amplifier system according to the prior art.
Figure 5:
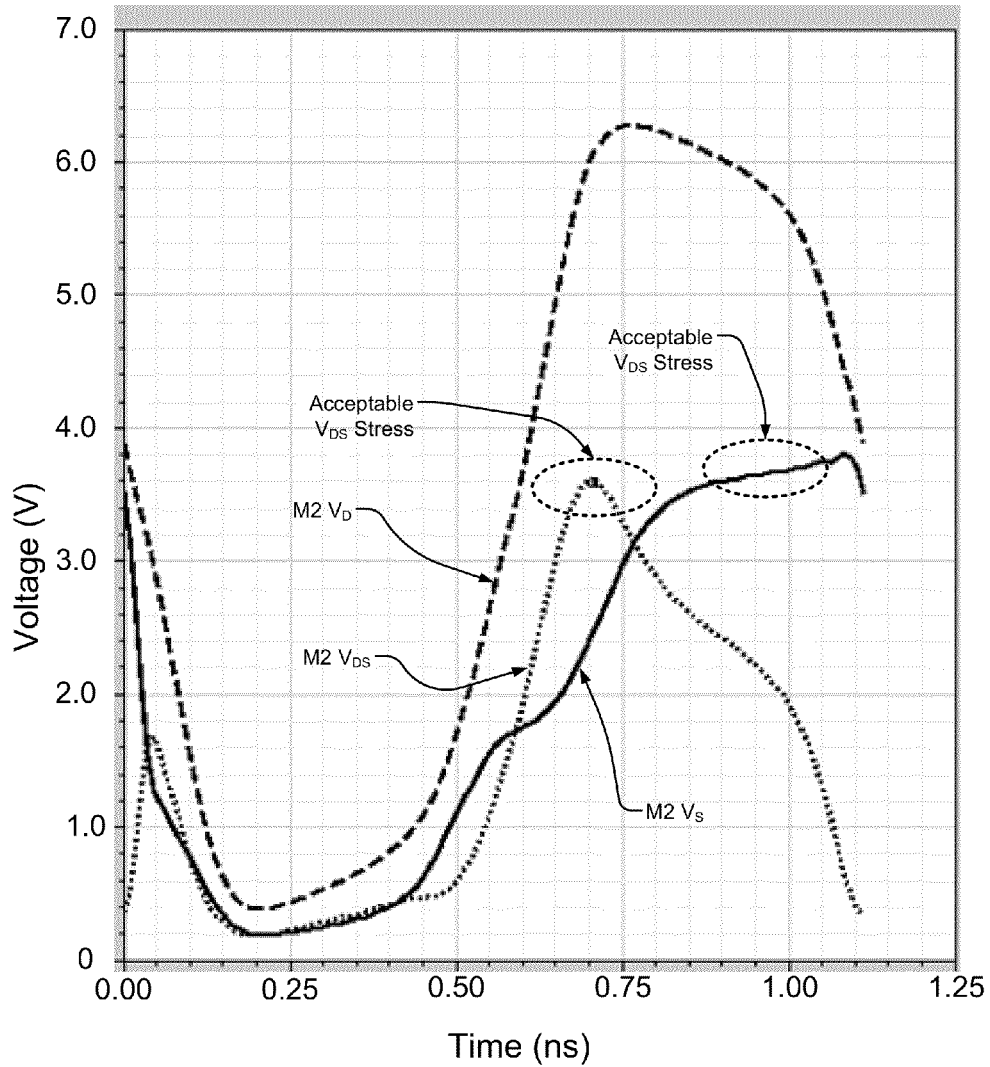
FIG. 5 is a graph illustrating examples of $V_D$, $V_S$ and $V_{DS}$ as a function of time for the amplifier system including the stress reducing circuit according to the present disclosure.

Referring now to FIGS. 4-5, the drain voltage $V_D$, the source voltage $V_S$ and the drain-source voltage $V_{DS}$ are shown as a function of time. In FIG. 4, example waveforms for the source and drain of $N_2$ in the cascode CS amplifier of FIG. 1. In FIG. 5, example waveforms for the source and drain of the transistor $N_2$ in the cascode CS amplifier 100 according to the present disclosure.

For example only, the cascode CS amplifier may be designed to work at 900 MHz. For example only, the peak voltage across the transistor $N_2$ is 3.6 V, while the peak voltage across the transistor $N_1$ is 3.8 V. In the classical design, the peak voltage across the transistor $N_2$ is 4.4 V. The transistor $P_1$ was sized to ⅛th the size of the transistor $N_1$.

The cascode CS amplifier according to the present disclosure is more effective at lower frequencies as the transistor $P_1$ charges the capacitance of the transistor $N_1$ and $N_2$. The transistor $P_1$ will introduce some additional capacitance to the input, although it will be small if the device is not sized too large.

Figure 6:
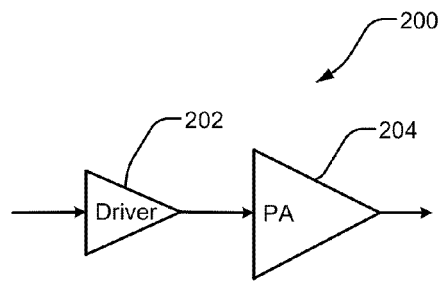
FIG. 6 is a functional block diagram of an example of a power amplifier system according to the present disclosure.
Figure 7:
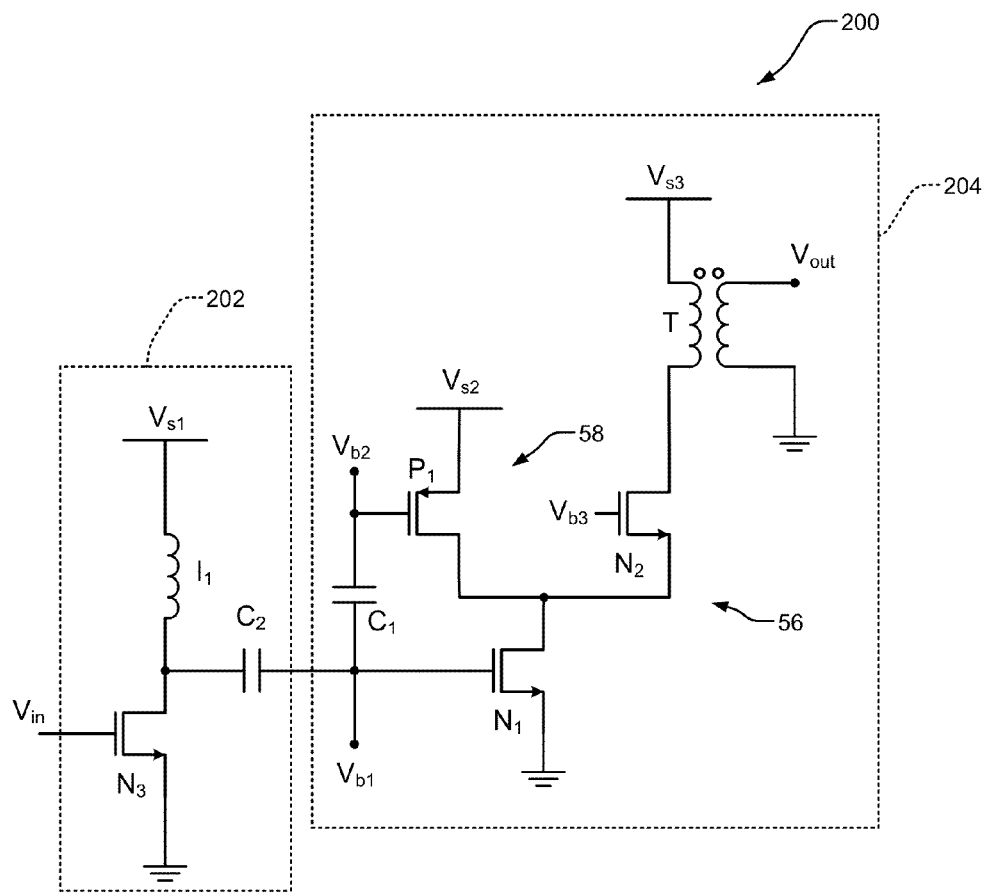
FIG. 7 is a more detailed functional block diagram and schematic of an example of a power amplifier including the amplifier system with the stress reducing circuit according to the present disclosure.

Referring now to FIGS. 6-7, an example of a power amplifier system 200 according to the present disclosure is shown. In FIG. 6, a driver 202 receives an input signal. The driver 202 drives a power amplifier 204, which generates an output signal. In FIG. 7, the driver 202 includes a transistor $N_3$ having a control terminal that receives an input signal. A first terminal of the transistor $N_3$ is connected to an inductor $I_1$. Another terminal of the inductor $I_1$ is connected to a first voltage source $V_{s1}$. For example only, the first voltage source $V_{s1}$ may operate at 1.8V.

A capacitor $C_2$ is connected between the inductor $I_1$ and the power amplifier 204, which includes the cascode CS amplifier 56 and the stress reducing circuit 58. More particularly, the capacitor $C_2$ is connected to the control terminal of the transistor $N_1$. A first terminal of the transistor $P_1$ is connected to a second voltage source $V_{s2}$. A first bias voltage $V_{b1}$ is connected to the control terminal of the transistor $N_1$. A second bias voltage $V_{b2}$ is connected to a control terminal of the transistor $P_1$. A third bias voltage $V_{b3}$ is connected to a control terminal of the transistor $N_2$. A primary side of a transformer T is connected to the first terminal of the transistor $N_2$ and to a third voltage source $V_{s3}$. For example only, the third voltage source $V_{s3}$ may operate at 3.6V. A secondary side of the transformer T provides the output signal.

For example only, the input signal may be a 1 mW signal at 900 MHz and the output signal may be a 1 W signal at 900 MHz. The input signal may be a sinusoidal signal having 0.3V amplitude and the output signal may be a sinusoidal signal having a 10V amplitude based on a 50 ohm termination.

A matching network is used at the output of the driver 202 in order to optimize the load impedance seen by the input transistor. Likewise the transformer T is used at the output of the power amplifier 204 in order to optimize the load impedance. To optimize the efficiency of the power amplifier stage, the voltage swing at the input of the transformer T may be nearly two times rail-to-rail (for example, 7.2 V). The present disclosure prevents unwanted stress to the transistors in the cascode CS amplifier under large signal conditions.

Figure 8:
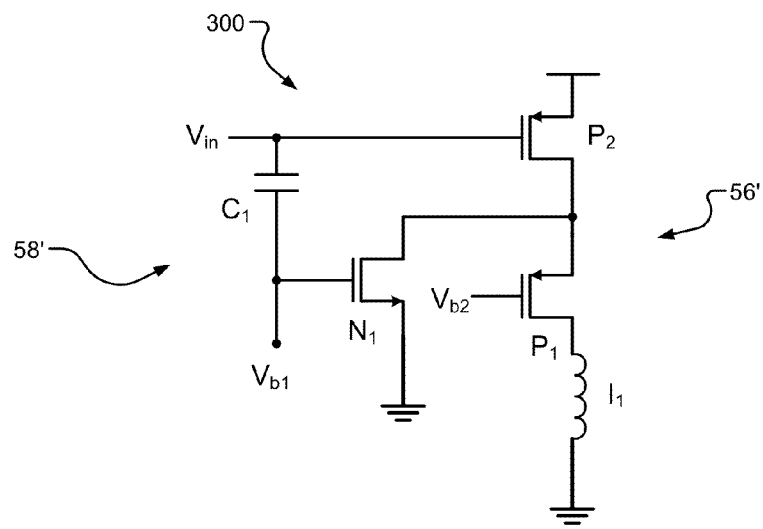
FIG. 8 is a schematic diagram of another example of an amplifier system including a stress reducing circuit according to the present disclosure.

Referring now to FIG. 8, another example of an amplifier system 300 according to the present disclosure is shown. The amplifier system 300 includes a cascode CS amplifier 56' and a stress reducing circuit 58'. The cascode CS amplifier 56' includes transistors $P_1$ and $P_2$, which include PMOS transistors. The stress reducing circuit 58' includes a transistor $N_1$ and a capacitor $C_1$. The transistor $N_1$ includes an NMOS transistor. The capacitor $C_1$ is connected between a control input of the transistor $N_1$ and a control input of the transistor $P_2$. An inductor $I_1$ or other load may be connected to a first terminal of the transistor $P_1$. Bias voltages $V_{b1}$ and $V_{b2}$ may be connected to control terminals of the transistor $N_1$ and the transistor $P_1$. An input voltage is supplied to the control terminal of the transistor $P_2$. The circuit in FIG. 8 operates in a manner that is similar to the circuit in FIG. 3.

Figure 9:
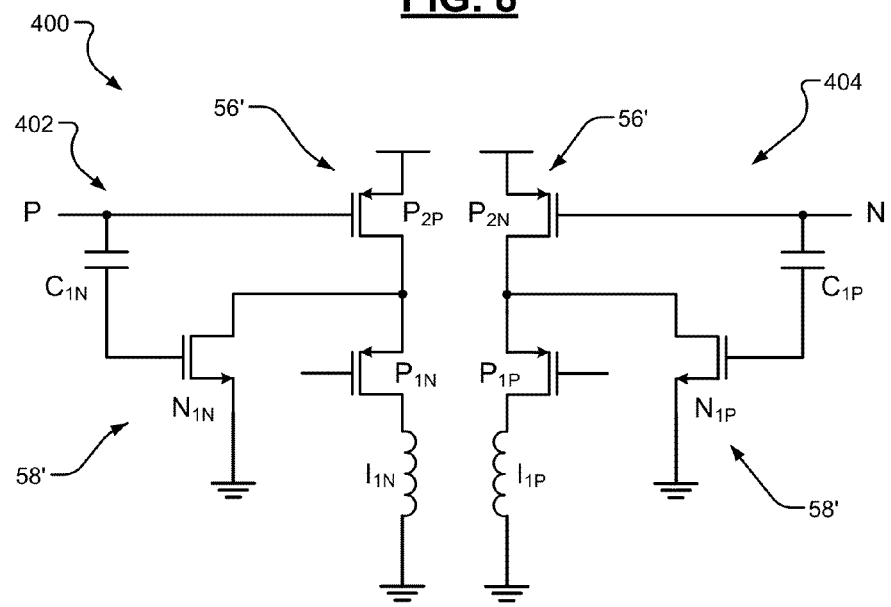
FIG. 9 is a schematic diagram of an example of a differential amplifier system with stress reducing circuits according to the present disclosure.

Referring now to FIG. 9, an example of a differential amplifier system 400 according to the present disclosure is shown. While the differential amplifier system 400 is a differential configuration of the amplifier in FIG. 8, other amplifiers described herein can also be arranged in a differential configuration. Circuit 402 is the same circuit as that shown in FIG. 8 (with subscript _A added), while circuit 404 is a mirror image of the circuit 402 (with the subscript _B added). First and second differential signal inputs are connected (at P and N) to control terminals of the transistors $P_{2P}$ and $P_{2N}$.

Figure 10:
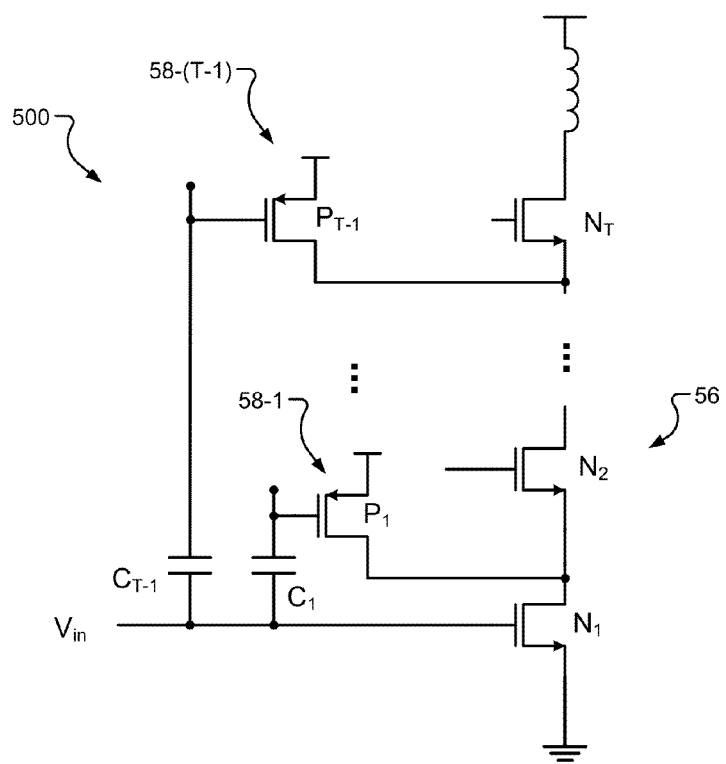
FIG. 10 is a schematic diagram of another example of an amplifier system with additional stages according to the present disclosure.

Referring now to FIG. 10, another example of an amplifier system 500 with additional stages according to the present disclosure is shown. The amplifier system 500 includes T transistors (such as the transistors $N_1, N_2, \ldots,$ and $N_T$) and the stress reducing circuits 56-1, ..., and 56-T-1 can include T-1 transistors (such as transistors $P_1, \ldots,$ and $P_{T-1}$) and capacitors (such as $C_1, \ldots,$ and $C_{T-1}$), where T is an integer greater than two.

By connecting the stress reducing circuits described above to a node between the transistors of the cascode CS amplifier, some leakage may occur. These circuits have a fixed vias voltage $V_b$. Another stress reducing circuit according to the present disclosure adjusts the voltage input to a gate of one of the transistors as needed to adjust distribution of voltage across the transistors to ensure minimum stress. This approach eliminates the leakage.

Figure 11:
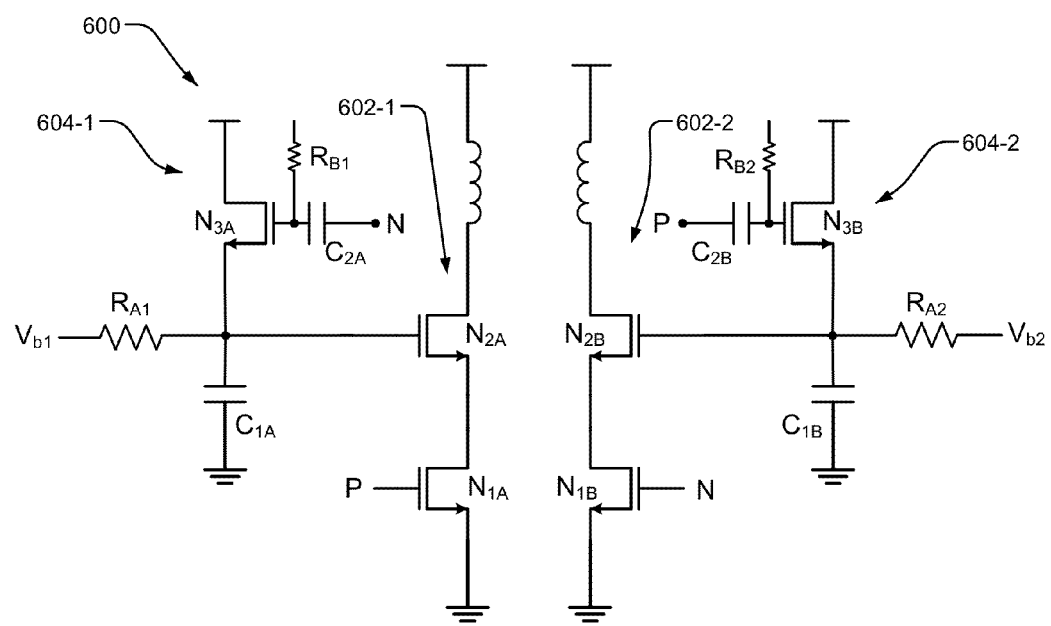
FIG. 11 is a schematic diagram of another example of a differential amplifier system with another stress reducing circuit according to the present disclosure.

Referring now to FIG. 11, an example of a differential amplifier system 600 including cascode CS amplifiers 602-1 and 602-2 and stress reducing circuits 604-1 and 604-2 according to the present disclosure is shown. The cascode CS amplifiers 602-1 and 602-2 include transistors $N_{1A}$ and $N_{2A}$ and $N_{1B}$ and $N_{2B}$, respectively, which may be NMOS transistors. The stress reducing circuits 604-1 and 604-2 includes transistors $N_{3A}$ and $N_{3B}$ and capacitors $C_{2A}$ and $C_{2B}$. Transistors $N_{3A}$ and $N_{3B}$ may be NMOS transistors. A bias voltage is connected via a resistance $R_{A1}$ and $R_{A2}$ to control inputs of the transistors $N_{2A}$ and $N_{2B}$, respectively. Capacitors $C_{1A}$ and $C_{1B}$ are also connected to control inputs of the transistors $N_{2A}$ and $N_{2B}$, respectively. One end of resistances $R_{B1}$ and $R_{B2}$ may be connected to control inputs of the transistors $N_{3A}$ and $N_{3B}$, respectively. An opposite end of the resistances $R_{B1}$ and $R_{B2}$ may be connected to a bias voltage or a reference potential.

When the input voltage to the cascode CS amplifier 602-1 swings low, the transistors $N_{2A}$ and $N_{2B}$ will turn off. The drain voltage $V_D$ of the transistor $N_{2B}$ may then swing as high as a load voltage. Since the control terminal of the transistor $N_{3A}$ is connected to the other input signal, the transistor $N_{3A}$ will turn on after the charging of the capacitor $C_{2A}$. When $N_{3A}$ turns on, the voltage at the gate of $N_{2A}$ increases as needed to adjust distribution of voltage across the transistors to ensure minimum stress. As can be appreciated, while NMOS transistors are shown in FIG. 11, PMOS transistors may be used.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A method of reducing stress in a cascode common-source amplifier, the cascode common-source amplifier including a first transistor and a second transistor connected in a cascode arrangement, the method comprising:
   providing an input voltage and a bias voltage to the first transistor and the second transistor, respectively, connected in the cascode arrangement;
   generating, based on the input voltage and the bias voltage, an output current; and
   equalizing stress associated with operation of each of the first transistor and the second transistor, wherein equalizing the stress includes, in response to the input voltage decreasing by an amount sufficient to cause the first transistor and the second transistor to turn off, equalizing respective voltage drops across the first transistor and the second transistor.

2. The method of claim 1, wherein equalizing the respective voltage drops across the first transistor and the second transistor includes, in response to the input voltage decreasing, pulling up, to a supply voltage, a drain voltage of the first transistor.

3. The method of claim 2, wherein the supply voltage is provided to a third transistor.

4. The method of claim 3, further comprising connecting (i) a first end of a capacitor to the supply voltage and the third transistor and (ii) a second end of the capacitor to the input voltage and the first transistor.

5. The method of claim 3, further comprising biasing the third transistor such that a conduction angle of the third transistor is less than 180 degrees.

6. The method of claim 3, wherein equalizing the respective voltage drops across the first transistor and the second transistor includes turning on the third transistor in response to the first transistor and the second transistor turning off.

7. The method of claim 3, wherein equalizing the respective voltage drops across the first transistor and the second transistor includes equalizing the respective voltage drops across the first transistor and the second transistor with a voltage drop across the third transistor.

8. The method of claim 3, wherein the first transistor and the second transistor correspond to NMOS transistors and the third transistor corresponds to a PMOS transistor.

9. A cascode common-source amplifier, comprising:
   a first transistor configured to receive an input voltage;
   a second transistor connected in a cascode arrangement with the first transistor, the second transistor configured to receive a bias voltage, the first transistor and the second transistor configured generate, based on the input voltage and the bias voltage, an output current; and a stress reducing circuit configured to equalize stress associated with operation of each of the first transistor and the second transistor, wherein, to equalize the stress, the stress reducing circuit is configured to, in response to the input voltage decreasing by an amount sufficient to cause the first transistor and the second transistor to turn off, equalize respective voltage drops across the first transistor and the second transistor.

10. The amplifier of claim 9, wherein, to equalize the respective voltage drops across the first transistor and the second transistor, the stress reducing circuit is configured to, in response to the input voltage decreasing, pull up, to a supply voltage, a drain voltage of the first transistor.

11. The amplifier of claim 10, wherein the stress reducing circuit includes a third transistor, and wherein the supply voltage is provided to the third transistor.

12. The amplifier of claim 11, further comprising a capacitor, wherein (i) a first end of the capacitor is connected to the supply voltage and the third transistor and (ii) a second end of the capacitor is connected to the input voltage and the first transistor.

13. The amplifier of claim 11, wherein the third transistor is biased such that a conduction angle of the third transistor is less than 180 degrees.

14. The amplifier of claim 11, wherein, to equalize the respective voltage drops across the first transistor and the second transistor, the stress reducing circuit is configured to turn on the third transistor in response to the first transistor and the second transistor turning off.

15. The amplifier of claim 11, wherein, to equalize the respective voltage drops across the first transistor and the second transistor, the stress reducing circuit is configured to equalize the respective voltage drops across the first transistor and the second transistor with a voltage drop across the third transistor.

16. The amplifier of claim 11, wherein the first transistor and the second transistor correspond to NMOS transistors and the third transistor corresponds to a PMOS transistor.

* * * * *